May 26, 1964 H. HENKER 3,134,906
PHOTOELECTRIC SEMICONDUCTOR DEVICE
Filed Oct. 27, 1961

3,134,906
PHOTOELECTRIC SEMICONDUCTOR DEVICE
Heinz Henker, Munich, Germany, assignor to Siemens & Halske Aktiengesellschaft, Berlin, Germany, a corporation of Germany
Filed Oct. 27, 1961, Ser. No. 148,257
Claims priority, application Germany Oct. 31, 1960
5 Claims. (Cl. 250—211)

My invention relates to light-responsive semiconductor devices with at least one p-n junction for sensing, controlling, regulating and current generating purposes.

The known photoelectric semiconductor p-n junction devices are provided with a disc of semiconductor material such as silicon of monocrystalline constitution which is sliced from a large crystal and which is provided with a large-area p-n junction at the surface to be impinged upon by the light rays. The cutting of such semiconductor discs from a large crystal involves considerable losses of semiconductor material and causes damage to the crystal surface so that the disc must be subjected to a considerable amount of etching.

It is an object of my invention to minimize or virtually eliminate such disadvantages and to afford the production of photoelectric semiconductor devices of increased efficacy.

According to my invention a relatively thin semiconductor rod of essentially monocrystalline constitution, provided with a reversely doped surface layer and thus containing a p-n junction in the surface zone, is mounted in the focal region of an optical system that collects and focuses the light rays, the axis of the semiconductor rod extending substantially through the focal point or focal line of the optical system. It is preferable to employ for this purpose a semiconductor rod which during manufacture is drawn to the desired small diameter which thereafter need not be subjected to machining operations. This obviates the considerable losses of material previously encountered by the necessity of cutting the semiconductor bodies from monocrystals and also prevents the crystal surface from being damaged by such cutting operation. The reversely doped surface layer is formed, for example, by diffusing the necessary donor or acceptor substance into the rod-shaped body or by providing the doping impurity substance during the monocrystalline growth of the rod. It is preferable to keep the reversely doped surface layer extremely thin so that the spectral sensitivity maximum can be shifted more toward shorter wave lengths and hence into the visible portion of the spectrum.

Such a device possesses a relatively large light-sensitive area. Furthermore, all light rays that impinge in parallel relation upon the optical system become collected and focused in the focal point or focal line of the optical system so that the utilization of the available quantity of light is considerably increased.

According to still another feature of my invention, the above-mentioned optical system of the semiconductor device consists essentially of a hollow cylindrical or parabolical concave mirror along whose focal axis the semiconductor rod is mounted.

The above-mentioned and other objects, advantages and features of my invention, said features being set forth with particularity in the claims annexed hereto, will be apparent from, and will be described in, the following with reference to the embodiments of photoelectric semiconductor junction-type devices according to the invention illustrated by way of example on the accompanying drawing in which:

Figure 1:
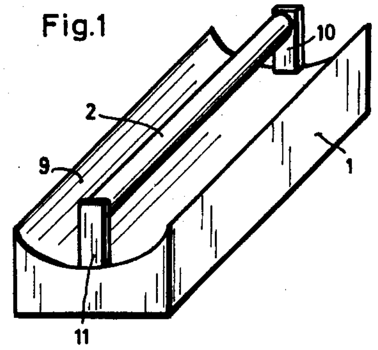
FIG. 1 shows schematically and in perspective a photoelectric device with a concave mirror formed of a metallized surface of a plastic body.

The device shown in FIG. 1 comprises an elongated cylindrical rod 2 consisting of monocrystalline semiconductor material of a few millimeters diameter. The rod preferably consists of silicon, a diameter of 1 to 5 mm. being preferable. The rod 2 extends substantially in the focal line of a concave cylindrical focusing mirror 1. This mirror may consist of shaped sheet metal or, as shown, of a plastic body whose cylindrical, concave surface is metallized to serve as a mirror. The cylindrical monocrystalline rod is provided along its cylindrical surface with a thin surface layer whose conductance type differs from that of the major inner portion or core of the rod. That is, when the main body of the rod consists of n-type silicon, the cylindrical surface is doped with acceptor substance such as boron, aluminum, gallium and indium in order to have p-type conductance so that a cylindrical p-n junction extends about the main body immediately beneath the outermost surface. The two ends of the rod are fastened in holders 10 and 11. However, the rod may also be embedded in transparent plastic material in which case the separate holders may be omitted and only electric wires for conducting current to the rod ends are needed. The radial spacing of the monocrystalline rod from the bottom of the cylindrical mirror surface is approximately $R/2$, where R denotes the radius of the cylindrical mirror surface.

Figure 2:
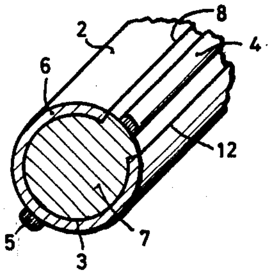
FIG. 2 shows in perspective and partly in section a portion of the crystalline semiconductor rod which forms part of the photoelectric device according to FIG. 1 as well as according to FIGS. 3 to 5.

The thin surface layer 6 of reverse doping (FIG. 2) is approximately in the same order of magnitude as the diffusion length of the charge carriers. Its boundary with the inner or main body 7 of the core forms the above-mentioned p-n junction schematically indicated at 3 in FIG. 2. For the purpose of contacting the body or core 7 by an electric conductor or terminal, the surface doping is interrupted along a narrow strip between two lines 8 and 12 that extend on the cylinder surface parallel to the rod axis. An ohmic contact 4 is attached to the body portion 7 of the rod within the range of the narrow strip and in insulated relation to the reversely doped surface layer 6. The ohmic contact 4 preferably extends from one rod end to the other and may consist of plated nickel or a gold-antimony alloy inlay for n-type material and an aluminum inlay for p-type material. The barrier-free contact of the surface layer 6 with one of the terminals is likewise effected by means of a metal strip 5 extending along the cylindrical body. The strip 5 may consist of the same material as strip 4. The described means of contacting the body portion 7 and the surface layer 6 lengthwise along substantially the entire monocrystalline rod is particularly favorable because it secures a particularly low resistance between any point of the body and surface layer and the respective terminals.

The device is applicable particularly as a photo-element or solar cell. When the device is irradiated with light whose wave length is below the absorption edge of the semiconductor material being used, this limit being at about 1.2 $\mu$m. for silicon, electron-hole pairs are generated in a region of the p-n junction 3 that depends upon the diffusion length of the charge carriers. The generated electron-hole pairs migrate by diffusion into the space-charge zone of the p-n junction and are driven by the diffusion voltage through the p-n junction. As a result, the space charge at the p-n junction is reduced and the diffusion voltage is reduced by the amount V. This voltage V appears between the ohmic (barrier-free) electrodes or terminals 4 and 5 as a utilizable photo-E.M.F.

Figure 3:
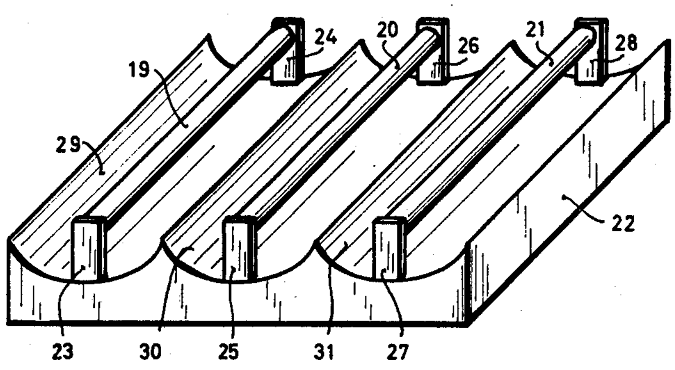
FIG. 3 is a perspective illustration of a photoelectric device comprising three cells combined to a single unit.

According to FIG. 3, several components as described above with reference to FIGS. 1 and 2 can be combined to a single unit. The rods 19, 20 and 21, mounted between pairs of holders or terminals 23 and 24, 25 and 26, 27 and 28, extend substantially along the respective focal axes of the focusing reflectors 29, 30 and 31.

Figure 4:
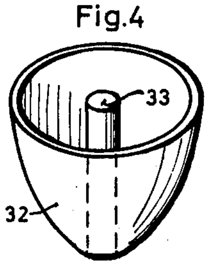
FIG. 4 shows schematically an embodiment of a photoelectric device in which the optical system consists essentially of a paraboloidal reflector.

FIG. 4 shows another preferred embodiment of a semiconductor device according to the invention. In this case, the preferably cylindrical monocrystalline rod 33 is mounted substantially on the axis of a concave reflector 32 consisting of a rotational paraboloid. The axis of the monocrystalline rod thus passes substantially through the focal point of the optical system. The reflector 32 may consist of sheet metal and may be given the desired shape by a spinning operation on a lathe or in any other suitable manner.

Figure 5:
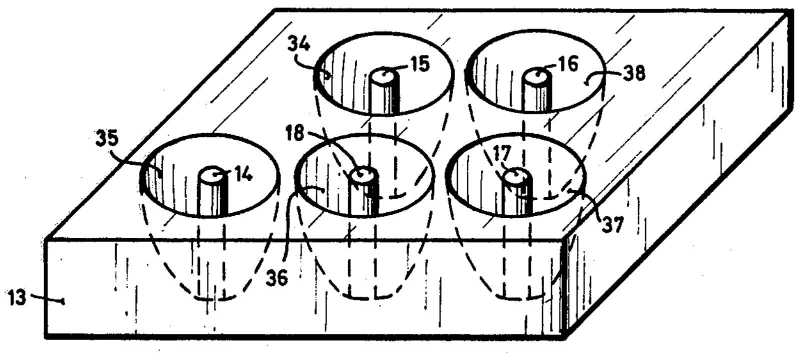
FIG. 5 is a perspective illustration of a multiple unit with paraboloidal reflector components.

In the embodiment of FIG. 5, a carrier body 13 comprises a number of internally metallized rotational paraboloidal cavities 34 to 38 in whose respective axes the semiconductor rods 14 to 18 are mounted. In such multiple arrangements the efficiency of the entire device is considerably improved. It will be understood that in such units, as well as that of FIG. 3, the component cell parts may be electrically connected in series relation if an increased voltage is desired or may be connected in parallel relation for increased current capacity.

In the embodiments of FIGS. 4 and 5 the contacting of the rods by the electrode or terminal members may be effected in the same manner as described above with reference to FIG. 2. It is preferable to place the individual paraboloidal reflectors according to FIG. 5 so close to each other that the reflector openings cover as much as possible of the entire area extending at a right angle to the impinging direction of the light, thus utilizing the greatest possible quantity of light per total surface area.

With all embodiments described above, it is of advantage to embed the optical system and the monocrystalline rod together in a transparent plastic such as casting resin. It is then preferable to cover the block of plastic with a thin glass pane on the side facing the source of light in order to minimize the effect of the atmosphere upon the plastic material, thereby preventing clouding or discoloring of the material.

The monocrystalline rod is produced, for example, by crucible-free (floating) zone pulling as shown in the application of Emeis, Serial No. 409,610, filed February 11, 1954, now Patent No. 3,030,194. The monocrystalline rod may also be produced by pulling from a melt of the material. For producing an accurate cylindrical shape, the regulating techniques of the above-mentioned Emeis application may be used as well as the techniques of Siebertz and Henker, application Serial No. 13,309, filed March 7, 1960. Another method is to grind the surface of the crystal to accurate cylindrical shape subsequent to production of the monocrystalline rod, but the latter method is less favorable for electrical reasons.

The reverse doping of the surface layer can be effected by diffusing doping substance into the material. In this case the above-mentioned longitudinal strip area between lines 8 and 12 in FIG. 2 that is to remain free of doping substance can be masked off by oxide, such as silicon dioxide. Another way of reverse doping is to first deposit a doping substance upon the cylindrical surface by spraying, dusting, vaporizing or by electrolytic means, and thereafter heating the rod sufficiently for alloying the doping substance into the rod surface. Still another way is to reversely dope the entire surface layer which can be done during the crystalline growth of the rod, and the reversely doped surface layer can then be eliminated at the strip-shaped area to be contacted by the terminals (between lines 8 and 12 in FIG. 2) by etching or mechanically.

Particularly favorable manufacturing methods are performed as follows.

A semiconductor rod of very low-ohmic silicon is drawn to a thin diameter. A high-ohmic layer having a specific resistance of approximately 1 ohm·cm. is precipitated upon this rod by thermal decomposition of a gaseous silicon compound. The p-n junction in this layer is formed by diffusing into the layer a corresponding doping substance, or by additional growth of material from the gaseous phase containing an addition of a gaseous compound of a doping substance. It is preferable to keep the specific resistance of the surface layer likewise low in order to keep the flow resistance for the photoelectric current as small as possible. Bischoff application Serial No. 87,885, filed February 8, 1961, shows the decomposition of gaseous silicon halogenides, e.g. silicontetrachloride and silicochloroform by hydrogen at temperatures between 900 to 1400° C. Illustrative of doping agents one can use are phosphorus chloride for n-doping and gallium chloride for p-doping.

Another favorable production method is the following. Used is a very low-ohmic drawn semiconductor rod. This rod is heated in vacuum, preferably by passing electric current through the rod, to such a high temperature that the doping substance evaporates out of the rod whereby a high-ohmic layer on a low-ohmic core is formed. This high-ohmic layer is then superficially doped to the reverse type of conductance, thus forming a p-n junction in the high-ohmic layer.

During the above-mentioned precipitation of reversely doping material, or during the diffusion of doping substance into the surface, a protective strip is preferably pressed against the rod along the longitudinal strip area that is to remain free of the reversely doped surface layer and is to be subsequently contacted by a terminal or electrode strip as described above with reference to FIG. 2. This protective strip should consist of a pure material that does not contaminate the semiconductor substance of the rod. Suitable for this purpose, for example, are hyperpure silicon, germanium, quartz, graphite, molybdenum or silicized molybdenum. The protective strip then prevents the growth of the reversely doped layer or, as the case may be, the reverse doping of the surface. The remaining strip, if necessary, after being subjected to slight etching, is thereafter contacted with the electrode or terminal strip so that the latter is in direct engagement with the low-ohmic drawn semiconductor rod, whereafter the reversely doped layer is likewise provided with an electric contact or electrode extending along the cylinder in parallel to the cylinder axis as described in the foregoing.

The above-mentioned contact or electrode strips 4 and 5 can be produced by depositing a suitable metal, forming a barrier-free contact with the semiconductor material, the deposition being effected by vaporization, dusting, spraying or by electrolysis. The shape of the contacting strips 4 and 5 may then be determined by the use of a stencil or mask which is preferably of the same materials used as the above-mentioned protective strips. The contact strips can also be produced by using wires and subjecting them to heat and pressure while they are in direct contact with the semiconductor body or a thin metallic intermediate layer.

The contacting at two locations along the cylindrical rod can be avoided by first drawing an extremely low-ohmic thin crystal, for example having a specific resistance less than 0.1 ohm·cm. and preferably less than 0.001 ohm·cm. Thereafter, a thin high-ohmic layer of the same material is grown on the surface of the rod by thermal decomposition of a semiconductor halogen compound in the manner described above. The specific resistance of this high-ohmic layer should be at least about 1 ohm·cm. Then a p-junction is produced by diffusion in the high-ohmic layer. The low-ohmic core then forms the electric contact or terminal for the inner layer so that only a single contact strip along a line on the outer surface of the cylinder is necessary for contacting the outer layer. It is also sufficient, after forming the p-n junction, to deposit a thin transparent layer upon the cylindrical surface, so that the second line-shaped contact strip can be avoided and a contacting of the rod becomes necessary only at the two ends of the rod.

While silicon is preferable, devices according to the invention can utilize germanium and $A_{III}B_{V}$ materials as described by Welker in Patent No. 2,798,989. Devices according to the invention are also of advantage for photoelectric semiconductor components of types other than particularly illustrated and described so far, such as photodiodes and phototransistors. Such and other modifications will be obvious to those skilled in the art, upon a study of this disclosure, without departure from the essential features of my invention and within the scope of the claims annexed hereto.

I claim:

1. A photoelectric semiconductor p-n junction device comprising at least one optical focusing system, an elongated cylindrical rod extending substantially through the focus of said system, said rod having a main body consisting essentially of monocrystalline semiconductor material of a given conductance type and having a surface layer of the other conductance type, and electrodes in contact with said body and with said layer respectively and extending along said rod in directions parallel to the rod axis.

2. In a photoelectric device according to claim 1, said electrodes extending lengthwise along the entire monocrystalline rod.

3. A light-responsive semiconductor p-n junction device, comprising a substantially monocrystalline semiconductor rod having a reversely doped surface layer, and an optical focusing system, said rod extending substantially through the focus of said system, both said semiconductor rod and said optical system are embedded in a transparent casting resin.

4. A light-responsive semiconductor p-n junction device, comprising a substantially monocrystalline semiconductor rod having a reversely doped surface layer, and an optical focusing system, said rod extending substantially through the focus of said system, both said semiconductor rod and said optical system are embedded in a transparent casting resin to produce an embedded device, said embedded device is covered by a thin glass pane whereby the semiconductor rod is between said glass pane and said optical system.

5. A light-responsive semiconductor p-n junction device, comprising a plurality of substantially monocrystalline semiconductor rods, each rod having a reversely doped surface layer, a common carrier for said semiconductor rods, said carrier forming a plurality of optical systems, and said semiconductor rods extending substantially through the focus of said optical systems.

References Cited in the file of this patent

UNITED STATES PATENTS

| | | |
|---|---|---|
| 2,766,144 | Lidow | Oct. 9, 1956 |
| 2,871,330 | Collins | Jan. 27, 1959 |
| 2,997,598 | Gramm | Aug. 22, 1961 |